United States Patent [19]

Terui et al.

[11] Patent Number: 4,575,748

[45] Date of Patent: Mar. 11, 1986

[54] SEMICONDUCTOR DEVICE

[75] Inventors: Kazuo Terui, Kawasaki; Rikio Sugiura, Sagamihara; Takehisa Sugawara, Kawasaki, all of Japan

[73] Assignee: Fujitsu Limited, Kawasaki, Japan

[21] Appl. No.: 564,711

[22] Filed: Dec. 23, 1983

[30] Foreign Application Priority Data

Dec. 29, 1982 [JP] Japan ................................ 57-231631

[51] Int. Cl.[4] ...................... H01L 23/02; H01L 23/12
[52] U.S. Cl. .......................................... 357/74; 357/70
[58] Field of Search ....................... 357/74, 70, 72, 80

[56] References Cited

U.S. PATENT DOCUMENTS 3,611,061 10/1971 Segerson ........................ 317/234 R
4,066,839 1/1978 Cossutta et al. ...................... 357/70

Primary Examiner—William L. Sikes
Assistant Examiner—Robert E. Wise
Attorney, Agent, or Firm—Staas & Halsey

[57] ABSTRACT

A semiconductor device having a base which receives therein a semiconductor chip and a plurality of lead terminals having inner ends which are connected to the semiconductor chip by connecting wires. The lead terminals are, at their outer ends, spaced from one another at a constant pitch, and are bent toward the respective outermost lead terminals between the inner ends and the outer ends and outside the base.

5 Claims, 8 Drawing Figures

SEMICONDUCTOR DEVICE

BACKGROUND OF THE INVENTION

1. Field of the Invention

This invention relates to a semiconductor device having a package which has therein a semiconductor chip, such as an integrated circuit (IC) or a large scale integrated circuit (LSI) which is connected to a plurality of lead terminals by means of wires. The present invention, in particular, relates to an improved arrangement of the connection of the lead terminals and the semiconductor chip.

2. Description of the Prior Art

In conventional semiconductor devices, the semiconductor chip has bonding pads to which the lead terminals are connected and which are usually located in the vicinity of the peripheral edges of the chip for the purpose of decreasing the length of the wires. If the connecting wires have a large length, they tend to hang down between the bonding pads and the lead terminals, resulting in so-called wire flow. This wire flow causes the wires to accidentally come into contact with a base of the package which supports the lead terminals, resulting in an increased possibility of breakage of the wires. This is particularly a problem when the semiconductor device is used in a vehicle such as an automobile, which is subject to vibration or impact. Therefore, a decrease in the length of the connecting wires is very important.

On the other hand, larger semiconductor chips are now required, to increase the packaging density thereof, yet smaller packages are required to decrease the size of the semiconductor device itself.

The base of the package for carrying the semiconductor chip has a peripheral edge adapted to support the terminal ends of the lead terminals (referred to as a margin area hereinafter). In order to make the package itself small and to enable a large semiconductor chip to be received in the package, the width of the margin area must be as small as possible.

Semiconductor devices of a conventional nature cannot fully satisfy the above-mentioned requirements.

SUMMARY OF THE INVENTION

The primary object of the present invention is to provide a semiconductor device in which the lead terminals can be located in close vicinity to the bonding pads of the semiconductor chip, so that the length of the connecting wires can be decreased, thereby resulting in the device being free from the undersirable wire flow.

With the decreased length of the connecting wires, it is possible to make the semiconductor device small, as a whole, and to enable the provision of a large semiconductor chip in the package.

In order to achieve the afore-mentioned object, according to the present invention, there is provided a semiconductor device having a package which has therein a semiconductor chip and a plurality of lead terminals which have inner ends received in the package. The inner ends of the lead terminals are connected to the semiconductor chip by connecting wires. The lead terminals have outer ends which are spaced from one another at a constant pitch. The lead terminals located between the outermost lead terminals and an intermediate lead terminal are bent toward the outermost lead terminals, at the intermediate portion of the lead terminals between the outer ends and the inner ends.

BRIEF DESCRIPTION OF THE DRAWINGS

The invention will be described below in detail with reference to the accompanying drawings, in which.

DESCRIPTION OF THE PREFERRED EMBODIMENTS

Figure 1:
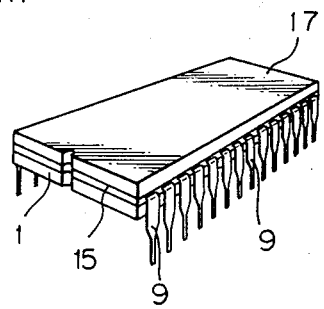
FIG. 1 is a perspective view of a conventional typical semiconductor device.
Figure 2:
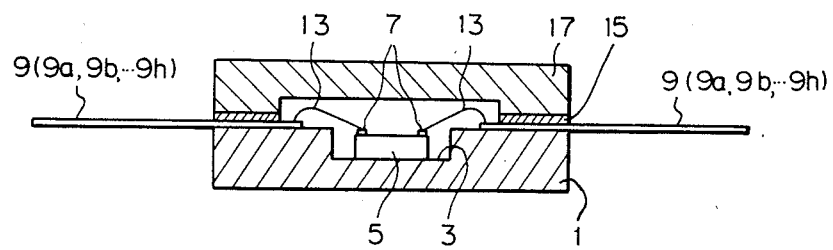
FIG. 2 is a sectional view of a conventional semiconductor device.
Figure 3:
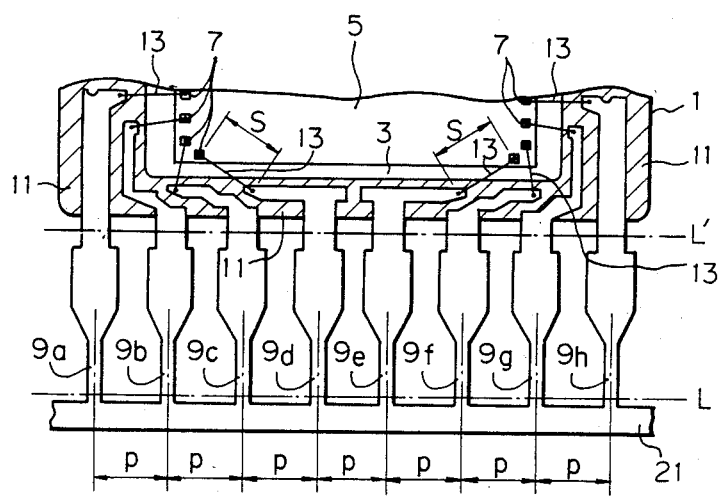
FIG. 3 is an enlarged plan view of a part of a conventional semiconductor device shown in FIGS. 1 and 2.

Referring first to FIGS. 1, 2 and 3, the semiconductor device has a base 1 which is made of, for example, ceramics. The base has a cavity 3 which receives therein a semiconductor chip 5, such as an IC or LSI. The semiconductor chip 5 has bonding pads 7 on its peripheral edges. The bonding pads 7 are arranged, for example, substantially in two rows along the opposite sides of the peripheral edge thereof. Lead terminals 9 are located on the peripheral edge of the base 1. The peripheral edge is referred to as a margin area 11.

In FIG. 3, eight lead terminals 9a, 9b, 9c, through 9h are provided on one side of the margin area 11. The lead terminals on the opposite side are not shown. The lead terminals are connected to the bonding pads 7 with connecting wires 13 by a conventional wire bonding method.

After the inner ends of the lead terminals 9 are connected to the corresponding bonding pads 7 by the connecting wires 13, a glass seal ring 15 and a ceramic cap 17 are located on the lead terminals 9 and the base 1, so that the cap 17 and the base 1 can be connected together by the glass of the seal ring 15, which is melted by heating. The assembly thus obtained forms a semiconductor package (not shown).

The lead terminals 9 which are made of a lead frame 21 are cut at the line L in FIG. 3, so that they are independent from each other. Furthermore, the separate lead terminals 9 are usually bent downward at the line L' (FIG. 3) as shown in FIG. 1. The outer ends of the lead terminals 9 are spaced from one another at a constant pitch P, as shown in FIG. 3. The pitch P is predetermined in accordance with a standard so as to register with, for example, through-holes of a printed circuit board (not shown) in which the semiconductor device is to be inserted. The pitch P cannot optionally vary.

In the conventional semiconductor device as shown in FIGS. 1, 2, and 3, the lead terminals 9 are spaced at a constant pitch, corresponding to the pitch P at the outer ends of the lead terminals, from one another even at the inner ends of the lead terminals located in the vicinity of the base 1. In other words, the pitch between the portions of the lead terminals 9 located at or in the vicinity of the peripheral edge lines of the base 1 is constant. Therefore, the lead terminals between the outermost lead terminals, in particular, the lead terminals 9d and 9e, are located far from the bonding pads 7 on the semiconductor chip 5. That is, the distance between the lead terminal 9d (9e) and the corresponding bonding pads 7 is S. Therefore, the length of the connecting wires 13, in particular for the lead terminals 9d and 9e, is relatively long, resulting in the problem of wire flow.

Figure 4:
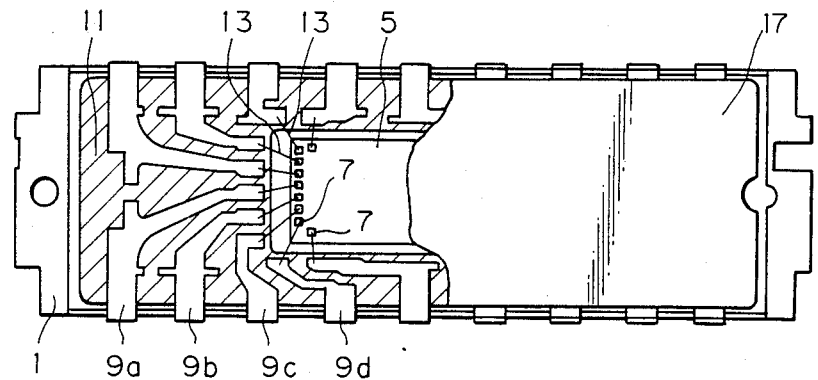
FIG. 4 is a partially sectioned plan view of a conventional semiconductor device.

Alternatively, if long connecting wires cannot be used because of the wire flow, only a small semiconductor chip can be provided in the package, as shown in FIG. 4. This is because, the small semiconductor chip 5 enables the margin area of the base 1 of the package to become large so that the inner ends of the lead terminals which lie on the margin area can be located in the vicinity of and as close as possible to the bonding pads. Namely, according to the prior art, if a large semiconductor chip is packaged, the length of the connecting wires is inevitably long, and on the other hand, if the length of the connecting wires is required to be small, only small semiconductor chips can be packaged.

It should be noted that FIG. 4 shows an actual arrangement of the lead terminals, which is slightly different from that in FIG. 3.

Figure 5:
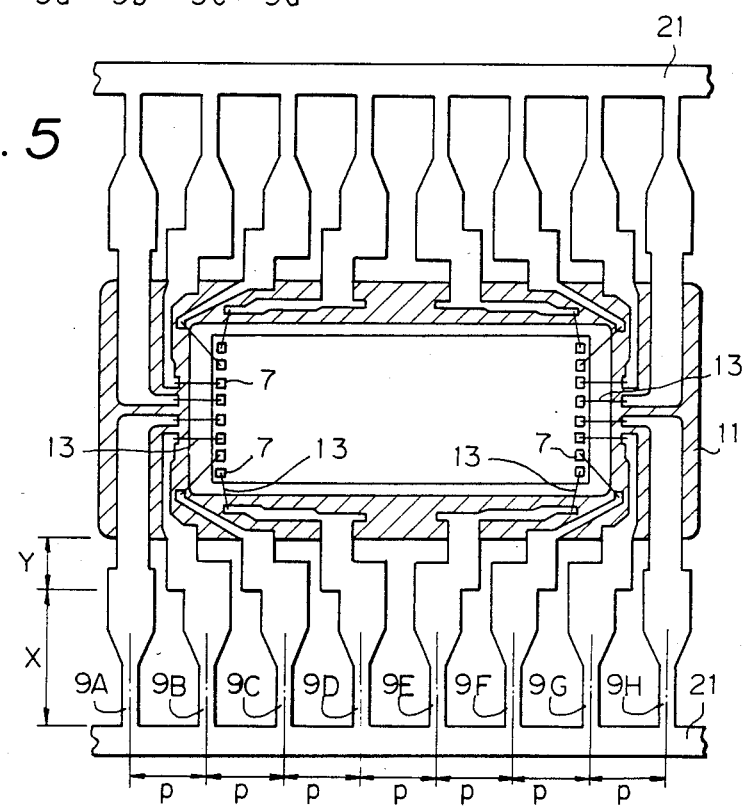
FIG. 5 is an enlarged plan view of a semi-conductor device according to the present invention.

According to the present invention, in order to solve the problem, namely, in order to decrease the length of the connecting wires as much as possible, the portions of the lead terminals that are located in the vicinity of the inner ends thereof are spaced at different pitches, i.e., different distances, as shown in FIG. 5.

As can be seen from FIG. 5, according to the present inveniton, the outer end areas of the lead terminals 9 (9A, 9B, 9C, . . ., 9G, 9H) which are designated by X in FIG. 5 are spaced at the predetermined constant pitch P, similar to FIG. 3, since the pitch P can not optionally vary, as mentioned above. However, the inner ends of the lead terminals that are located in the vicinity of the margin area 11 of the base 1 and that are designated by Y in FIG. 5 are separated by different pitches, i.e., different distances.

Namely, according to the present invention, the lead terminals which are located between the outermost opposite lead terminals 9A and 9H are bent toward the respective outermost lead terminals. In the illustrated embodiment, all of the intermediate lead terminals between the lead terminals 9A and 9H, i.e., the lead terminals 9B, 9C, 9D, 9E, 9F and 9G, are bent toward the respective outermost lead terminals 9A and 9H. Namely, the lead terminals 9B, 9C, 9D are bent toward the left outermost lead terminals 9A, and the lead terminals 9E, 9F, and 9G are bent toward the right outermost lead terminal 9H. If necessary, however only some of the lead terminals between the outermost lead terminals may be bent.

The inner end areas Y and, accordingly, the inner ends of the lead terminals can be located closer to the bonding pads 7 on the semiconductor chip 5, in comparison with FIG. 3. As a result, the lengths of the connecting wires 13 can be shortened, resulting in a decrease of the possibility of wire flow. In particular, the connecting wires for the lead terminals 9D and 9E can be remarkably shortened, in compairson with FIG. 3.

Figure 6:
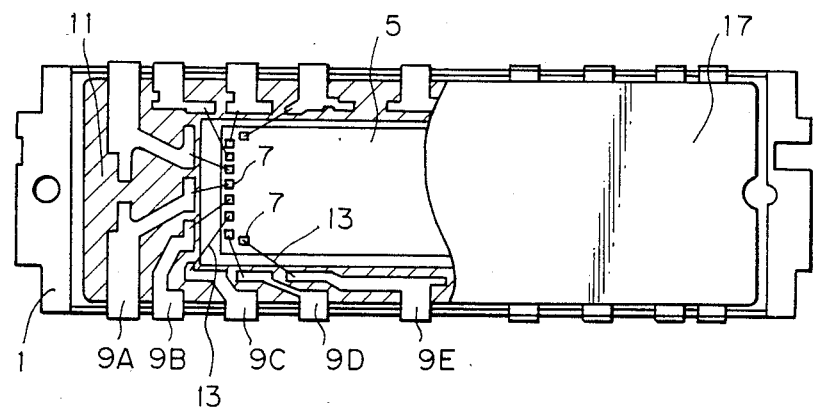
FIG. 6 is a partially sectioned plan view of a semiconductor device according to the present invention.
Figure 7:
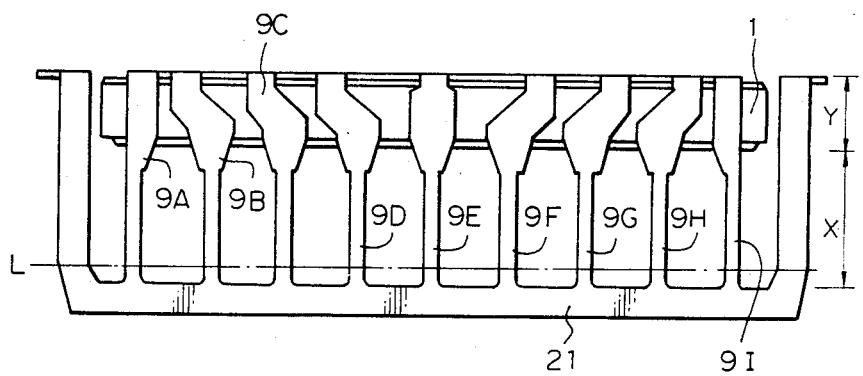
FIG. 7 is a front elevational view of FIG. 6.

When the number of the lead terminals is odd, as shown in FIGS. 6 and 7, the center intermediate lead terminal 9E can be bent either toward the right or left outermost lead terminal 9A or 9I, in accordance with the location of the relevant bonding pad.

FIGS. 6 and 7 show a large semiconductor chip 5. According to the present invention, as can be easily seen from comparison between FIG. 3 and FIG. 6, a larger semiconductor chip can be packaged. FIG. 6 shows one example of an actual arrangement of the lead terminals of a product according to the present invention. The packaging of a larger semiconductor is made possible because the lead terminals between the outermost lead terminals are bent toward the respective outermost lead terminals at the portions of the lead terminals located outside the base 1, as mentioned above, according to the present invention.

The larger the semiconductor chip, the longer the connecting wires for the intermediate lead terminals, but even if a larger semiconductor chip is packaged, the lengths of the connecting wires can still be shorter than those in the prior art.

Figure 8:
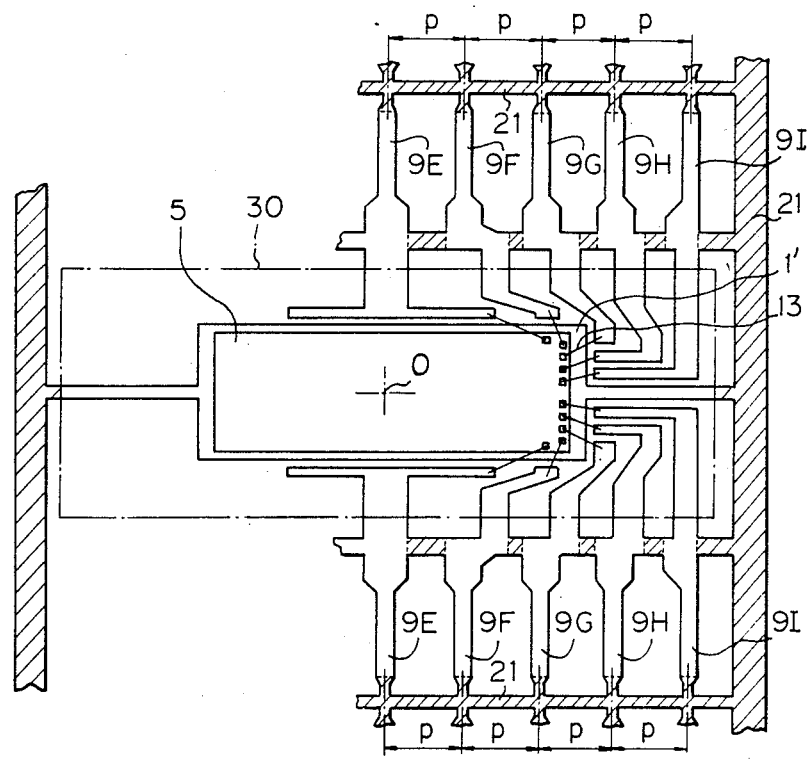
FIG. 8 is an enlarged plan view of a part of another embodiment of the present invention.

FIG. 8 shows a plastic-molded semiconductor device to which the present invention is also applied. As is well known, in plastic-molded semiconductor device, the semiconductor chip 5 is located on the base 1' which is a part of the lead frame 21 and which is usually called a die stage. Namely, since there is no base 1 having the cavity 3 as in the ceramic package shown in FIGS. 5 to 7, no margin area 11 can be provided on the stage 1'. The lead terminals 9 and the semiconductor chip 5 on the stage 1' can be molded together by a resin material shown by the line 30 in FIG. 8 showing an imaginary boundary. After molding, the portions of the lead frame 21, shown by hatching in FIG. 8, are cut and removed, so that the stage 1', and the lead terminals can be seaprated from each other. Also in this kind of plastic-molded semiconductor package, according to the present invention, the lead terminals are bent toward the respective outermost lead terminals to decrease the lengths of the connecting wires 13, as shown in FIG. 8.

Namely, the same technical idea as the foregoing is applicable also to a plastic-molded semiconductor package as shown in FIG. 8. It should be noted that FIG. 8 shows only a half of the arrangement of the lead terminals, since the arrangement is symmetrical with respect to the vertical line as well as the horizontal line crossing the center O (FIG. 8) of the semiconductor chip 5. Namely, arrangements which are the same as the arrangement of the connection between lead terminals 9E to 9I and the bonding pads of the semiconductor chip 5 also exist in the left lower quarter, and the left upper quarter, although they are not shown in FIG. 8 for the purpose of clarification.

As can be seen from the above mentioned discussion, according to the present invention, the bonding pads can be localized on the peripheral edge of the semiconductor chip, the lengths of the connecting wires for connecting the lead terminals and the bonding pads can be decreased, and a larger semiconductor chip can be packaged in the semiconductor device without making the semiconductor device itself larger.

We claim:

1. A semiconductor device that minimizes the area utilized as the base margin, comprising:

a semiconductor chip having a plurality of bonding pads;

means for enclosing the chip, including a base portion for holding the chip and a base margin around the periphery of the base portion; and a plurality of lead terminals, each lead terminal including a connector pad lying on the base margin adjacent to the corresponding bonding pad of the chip and connected to the corresponding bonding pad by a connecting wire, a connector leg having first, second and intermediate portions, the center lines of the second portions of the connector legs being spaced at a constant pitch from one another, the first portion connecting the intermediate portion to the connector pad, and the first portion of the connector leg of at least one of the lead terminals being off-center from the second portion of the connector leg.

2. A semiconductor device according to claim 1, wherein said base has a peripheral portion for supporting the first portions of the connector legs of the lead terminals.

3. A semiconductor device according to claim 1, wherein the means for enclosing the chip comprises a plastic-molded semiconductor package.

4. A semiconductor device, comprising:

a package;

a semiconductor chip contained in said package;

a plurality of connecting wires connected to said semiconductor chip;

a plurality of lead terminals, the lead terminals each having a first portion, connected to the semiconductor chip by the connecting wires, and a second portion extending outside of the package, the second portion of the lead terminals having a first leg and a second leg, the second legs of the lead terminals being spaced from one another at a constant pitch, at least one of the lead terminals including an intermediate leg located between and connected to the first and second legs, the intermediate leg being at an angle to the first leg and the second leg and displacing the first leg with respect to the second leg.

5. A semiconductor device according to claim 4, wherein said package is a plastic-molded semiconductor package.

* * * * *